United States Patent
Nishiguchi et al.

[11] Patent Number: 6,154,476
[45] Date of Patent: Nov. 28, 2000

[54] SEMICONDUCTOR LASER DIODE

[75] Inventors: Harumi Nishiguchi; Yuji Ohkura, both of Tokyo, Japan

[73] Assignee: Mitsubishi Denki Kabushiki Kaisha, Tokyo, Japan

[21] Appl. No.: 09/047,386

[22] Filed: Mar. 25, 1998

[30] Foreign Application Priority Data

Nov. 5, 1997 [JP] Japan ................................. 9-303071

[51] Int. Cl.$^7$ ........................................................ H01S 5/00
[52] U.S. Cl. .................................................. 372/46; 372/45
[58] Field of Search ................................ 372/20, 46, 45

[56] References Cited

U.S. PATENT DOCUMENTS

| | | | |
|---|---|---|---|
| 5,095,489 | 3/1992 | Nagai et al. ............................. | 372/49 |
| 5,297,158 | 3/1994 | Naiou et al. ............................ | 372/46 |
| 5,581,570 | 12/1996 | Yoshida et al. ........................ | 372/46 |
| 5,761,232 | 6/1998 | Nakayama ............................. | 372/46 |

OTHER PUBLICATIONS

Shima et al., "0.78– and 0.98–$\mu$m Ridge–Waveguide Lasers Buried With AlGaAs Confinement Layer Selectively Grown By Chloride–Assisted MOCVD", IEEE Journal of Selected Topics In Quantum Electronics, vol. 1, No. 2, Jun. 1995, pp. 102–109.

*Primary Examiner*—Frank G. Font
*Assistant Examiner*—Armando Rodriguez
*Attorney, Agent, or Firm*—Leydig, Voit & Mayer, Ltd.

[57] ABSTRACT

A semiconductor laser diode includes a p-type GaAs semiconductor substrate, a p-type region which includes a p-type AlGaAs lower cladding layer, an active layer and an n-type region which includes an n-type AlGaAs upper cladding layer, wherein the n-type AlGaAs upper cladding layer is $Al_xGa_{1-x}As$ ($x \geq 0.4$) having a carrier concentration of no more than $6 \times 10^{17}$ cm$^{-3}$.

7 Claims, 6 Drawing Sheets

SEMICONDUCTOR LASER DIODE

BACKGROUND OF THE INVENTION

1. Field of the Invention

The present invention relates to a semiconductor laser diode. More particularly, it relates to a semiconductor laser diode used as a light source for information processing.

2. Description of the Related Art

Figure 10:
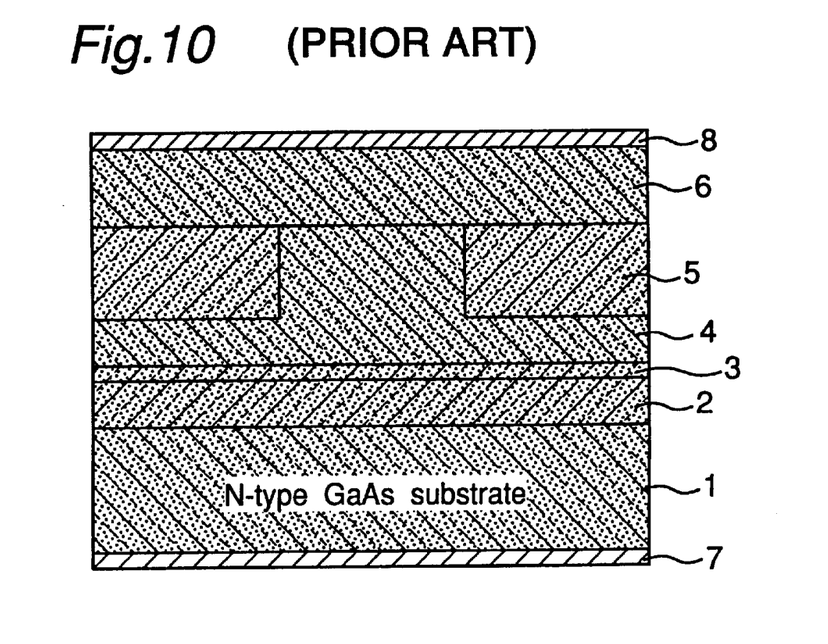
FIG. 10 is a schematic cross sectional view of the conventional semiconductor laser diode.

A conventional semiconductor laser diode has such a semiconductor structure, for example, as an n-type AlGaAs lower cladding layer 2, an active layer 3, a p-type AlGaAs upper cladding layer 4 and a p-type GaAs contact layer 6 are laminated on an n-type GaAs substrate 1 as shown in FIG. 10, wherein n-type GaAs current block layer 5 is formed on either side of the p-type AlGaAs upper cladding layer 4 which is etched out to leave a ridge portion, an n electrode 7 is formed on the bottom face of the n-type GaAs substrate 1, and a p electrode 8 is formed on the p-type GaAs contact layer 6. A semiconductor laser diode is generally used in conjunction with a drive IC. The semiconductor laser diode of the prior art shown in FIG. 10 is based on an n-type GaAs substrate 1 (cathode common laser diode), and is therefore used in conjunction with npn transistors. However, a pnp transistor is generally capable of operating at a higher speed than an npn transistor, and therefore it is preferable that the drive IC be made by using pnp transistors. For this reason, it is preferable to use a semiconductor laser diode of the so-called anode common type which has such a structure as the conductivity type of the semiconductor laser diode of FIG. 10 is reversed, namely a p-type GaAs substrate is used and a positive electrode is used as a common electrode.

However, a semiconductor laser diode of anode common type made by using an p-type GaAs substrate suffers a significant leak current and current diffuses in the n-type cladding layer which makes it impossible to inject current efficiently into an active region. This problem has been making it difficult to obtain a desired laser oscillation characteristic from a semiconductor laser diode of anode common type made by using a p-type GaAs substrate.

It can also be conceived to use a semiconductor laser diode (cathode common type) made by using an n-type GaAs substrate in conjunction with a drive IC employing pnp transistors by modifying the wiring of the semiconductor laser diode. This configuration is capable of single beam operation but is difficult to operate in multi-beam mode.

SUMMARY OF THE INVENTION

An object of the present invention is to provide a semiconductor laser diode made by using a p-type GaAs substrate, which can be used in combination with npn transistors and has performance not less than that of the conventional semiconductor laser diode made by using an n-type GaAs substrate.

The present inventors have found that, in a semiconductor laser diode made by using a p-type GaAs substrate, good characteristics can be obtained by making an n-type lower cladding layer in a specified composition and setting the carrier concentration to a specified value. Thus, the present invention has been completed.

That is, the semiconductor laser diode of the present invention comprises:

a semiconductor substrate made of p-type GaAs, a p-type semiconductor region which includes a p-type AlGaAs lower cladding layer and is formed on the semiconductor substrate; and an n-type semiconductor region which includes an n-type AlGaAs upper cladding layer and is formed on the p-type semiconductor region via an active layer, the n-type AlGaAs upper cladding layer comprising a first region formed over substantially the entire surface of the active layer for confining light in the active layer and a ridge portion provided for concentrating and injecting current into a laser oscillation region having a specified width in the active layer, wherein the n-type AlGaAs upper cladding layer is made of $Al_xGa_{1-x}As$ of which composition is set to be $x \geq 0.4$ and carrier concentration is controlled within $6 \times 10^{17}$ $cm^{-3}$.

Further in the semiconductor laser diode, carrier can be effectively confined in the active layer by forming a current blocking layer made of p-type GaAs on either side of the ridge portion of the n-type AlGaAs upper cladding layer and controlling the carrier concentration in the current blocking layer to $1 \times 10^{19}$ $cm^{-3}$ or higher.

Further in the semiconductor laser diode, in case current blocking layer which is made of p-type semiconductor of a composition represented by general formula $Al_yGa_{1-y}As$ and has a thickness of 0.5 μm or greater is provided on either side of the ridge portion of the n-type AlGaAs upper cladding layer while the composition of the current blocking layer is controlled to satisfy $y \geq x$ and the carrier concentration is set to $1 \times 10^{18}$ $cm^{-3}$ or higher, then current block effect can be made better than in the case of forming the current blocking layer by using GaAs and absorption of light in the current blocking layer can be decreased.

Further in the semiconductor laser diode, in order to obtain better current block effect, the current blocking layer preferably has a thickness of 1 μm or greater and carrier concentration of $8 \times 10^{18}$ $cm^{-3}$ or higher.

Also in the semiconductor laser diode, in order to obtain good droop characteristic, it is preferable that a reflecting film be formed on both resonating end faces and the reflectivity of the reflecting film be controlled within a range from 60% to 90%.

Further in the semiconductor laser diode, reflectivity of the reflecting film is more preferably controlled within a range from 70% to 80%.

DESCRIPTION OF THE PREFERRED EMBODIMENTS

Preferred embodiments of the present invention will now be described below with reference to the accompanying drawings.

Embodiment 1

Figure 1:
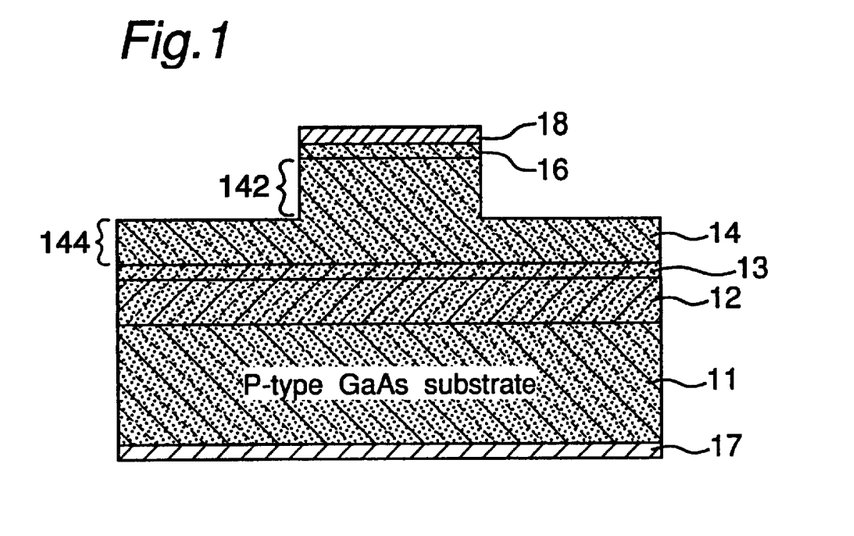
FIG. 1 is a schematic cross sectional view of the semiconductor laser diode according to the first embodiment of the present invention.

The semiconductor laser diode according to the first embodiment of the present invention comprises a p-type GaAs substrate 11 having a p-type positive electrode 17 formed on the bottom surface thereof, whereon a p-type lower cladding layer 12 made of p-type AlGaAs, an active layer 13, an n-type upper cladding layer 14 made of n-type AlGaAs, a contact layer 16 made of n-type GaAs and a n-type negative electrode 18 are formed, as shown in FIG. 1. In the first embodiment, the n-type upper cladding layer 14 comprises a first region 141 formed over substantially the entire surface of the active layer for the purpose of confining light in the active layer, and a ridge portion 142 where a specified width of current path is formed.

In this specification, when simply referring to AlGaAs, it generally means $Al_xGa_{1-x}As$ $(0<x<1)$.

In the semiconductor laser diode of the first embodiment, in particular, the n-type upper cladding layer 14 is formed from n-type AlGaAs semiconductor represented by general formula $Al_xGa_{1-x}As$ where $x \geq 0.4$ and the carrier concentration thereof is controlled within $6 \times 10^{17}$ cm$^{-3}$. With this configuration, current injected into the specified width via the ridge portion 142 is prevented from diffusing in the direction of width in the first region.

Figure 2:
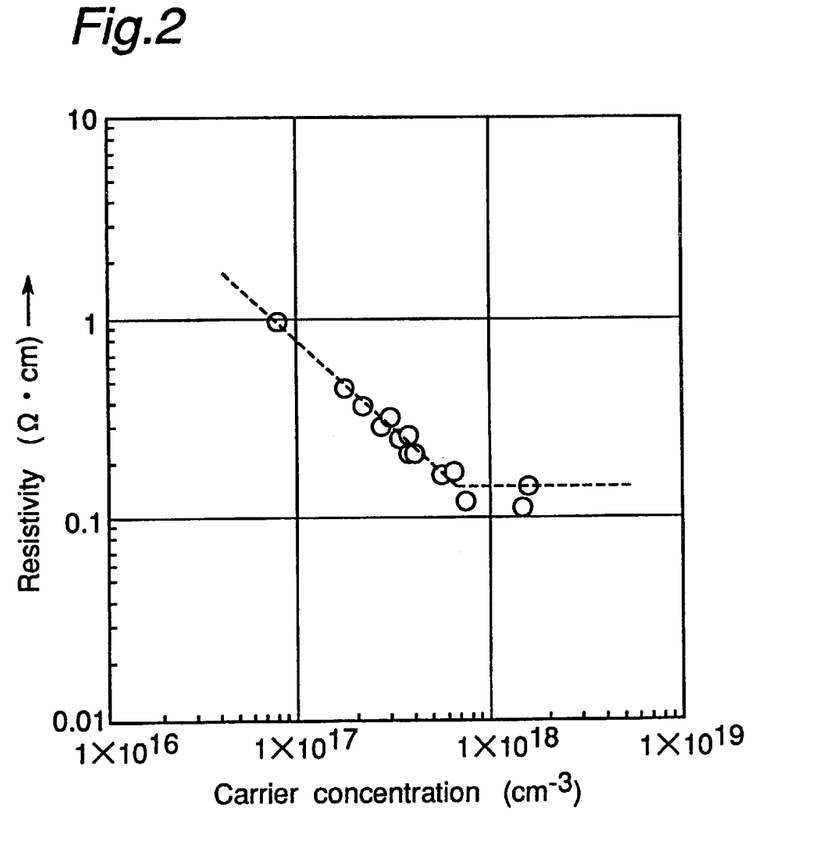
FIG. 2 is a graph showing the resistivity vs. carrier concentration when the $Al_xGa_{1-x}As$ semiconductor (x=0.48) is doped with Se.
Figure 3:
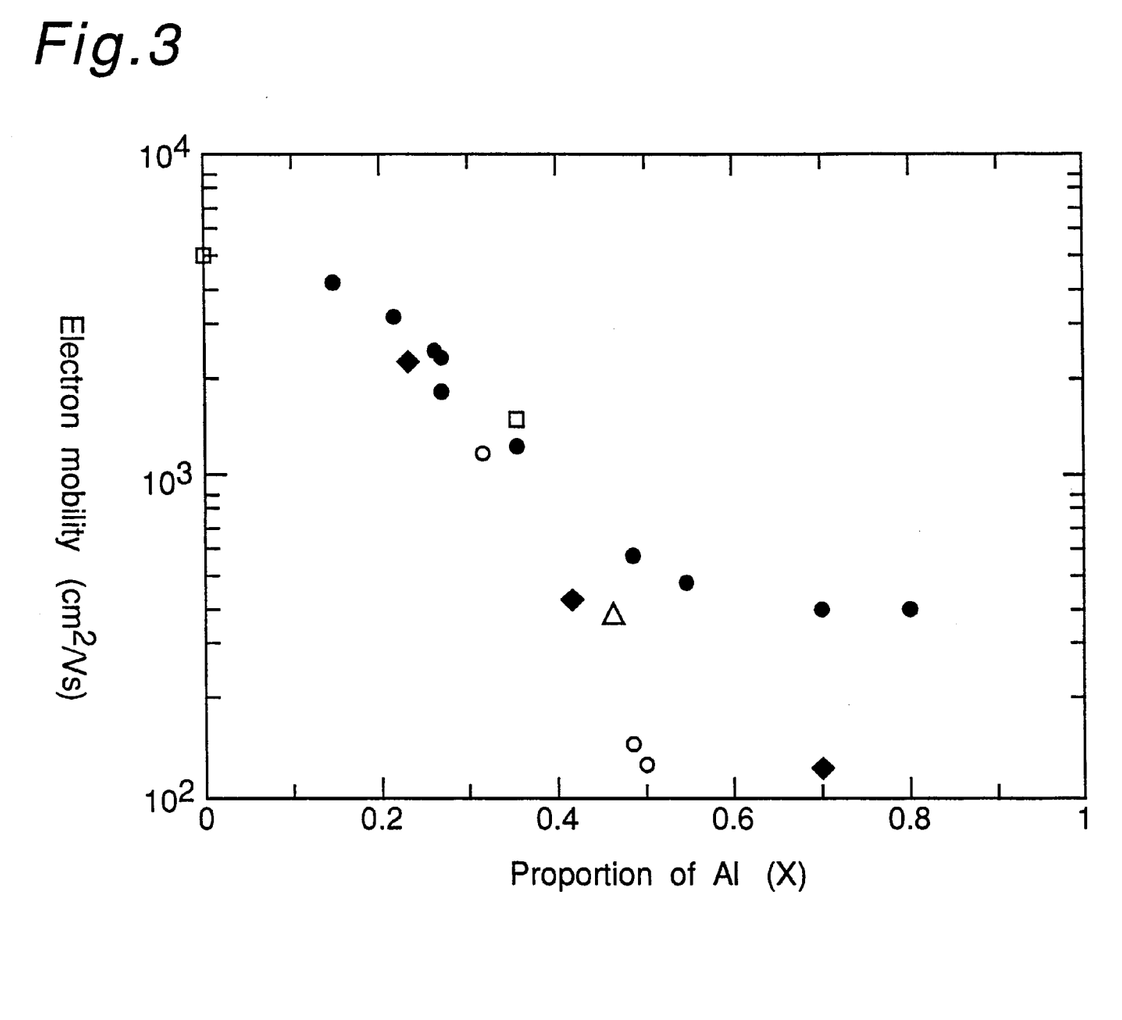
FIG. 3 is a graph showing the electron mobility vs. the proportion of Al in the $Al_xGa_{1-x}As$ semiconductor.

That is, in the n-type upper cladding layer 14 represented by general formula $Al_xGa_{1-x}As$, according to the first embodiment, the composition is controlled to satisfy $x \geq 0.4$ so that a relatively low electron mobility is obtained as shown in FIG. 3, and the carrier concentration is controlled within $6 \times 10^{17}$ cm$^{-3}$ thereby controlling the resistivity of the n-type upper cladding layer 14 to a relatively high value as shown in FIG. 2. While the graph of FIG. 3 shows that the electron mobility remains substantially constant in a region where x is greater than 0.4, the point of inflection (x=0.4) can shift somewhat depending on the conditions of manufacturing the semiconductor layer. When this shift is taken into consideration, it is preferable that the composition be controlled to satisfy $x \geq 0.45$ for the purpose of the present invention.

The n-type upper cladding layer 14 is doped with Si, Se or the like as an n-type impurity, and p-type lower cladding layer 12 is doped with Zn, Mg or the like as a p-type impurity.

With regards to the upper limit for the proportion of Al, because electron mobility remains substantially constant in a region where $x \geq 0.4$ in the n-type upper cladding layer 14 represented by general formula $Al_xGa_{1-x}As$ as shown in FIG. 3, the upper limit of x is 1 and may be set to a value within a range of $1 > x \geq 0.4$ based on the index of refraction which is required for the n-type upper cladding layer 14.

With regards to the lower limit of the carrier concentration, although the present invention is not subject to a lower limit of the carrier concentration, in particular, it is not desirable to set the resistivity of the n-type upper cladding layer 14 too high in consideration of the function of the n-type upper cladding layer 14 as a current path, and it is preferable to set the carrier concentration to $5 \times 10^{16}$ cm$^{-3}$ or higher.

In the n-type upper cladding layer 14 of the semiconductor laser diode according to the first embodiment made in such a configuration as described above, because current injected into the specified width through the ridge portion 142 is prevented from diffusing in the direction of width in the first region, current can be injected efficiently into the active region. Thus laser oscillation characteristic similar to that of the conventional semiconductor laser diode made by using n-type GaAs substrate or higher can be obtained with an anode common type semiconductor laser diode made by using the p-type GaAs substrate 11.

This configuration can also be combined with a drive IC which employs high-speed npn transistors without particular modification of the wiring configuration, and is therefore capable of multi-beam operation as well as single beam operation.

Figure 9:
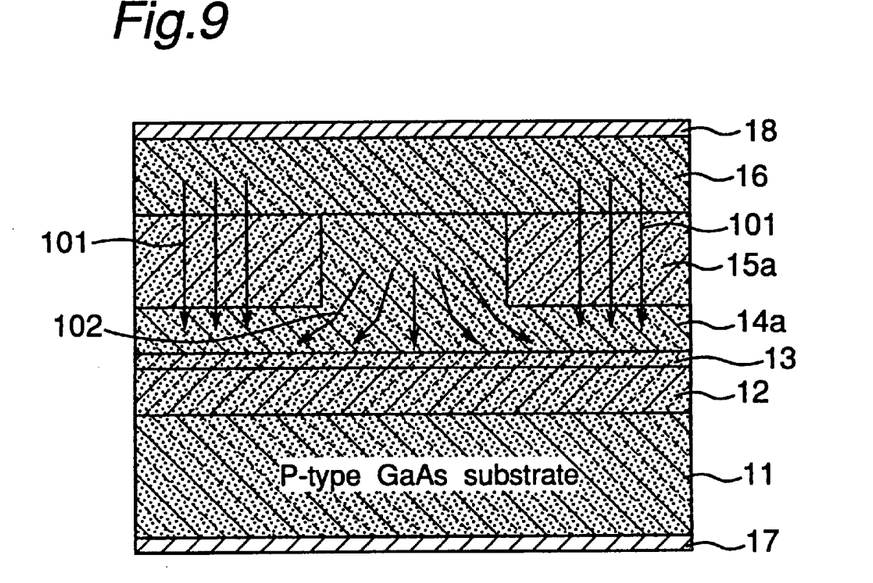
FIG. 9 is a schematic cross sectional view showing the leak current and the diffusion of current in the upper cladding layer.

Also because the semiconductor laser diode of the first embodiment is not provided with the current blocking layer which is used in the second and third embodiments to be described later, there occurs no current leakage (indicated by arrow 101 in FIG. 9) through the current blocking layer and therefore threshold can be made lower and a higher efficiency can be achieved.

Moreover, absence of the current blocking layer makes it possible to simplify the production process and avoid polycrystal deposition of GaAs or AlGaAs and formation of pits which cause troubles during recrystallization, so that semiconductor laser diode of high reliability can be manufactured.

Embodiment 2

Figure 4:
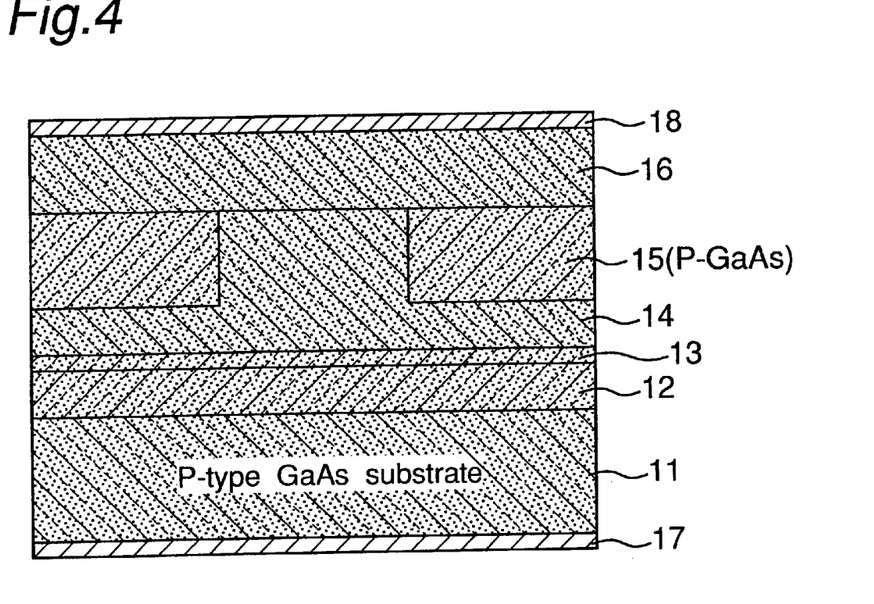
FIG. 4 is a schematic cross sectional view of the semiconductor laser diode according to the second embodiment of the present invention.

The semiconductor laser diode according to the second embodiment of the present invention has the configuration of the first embodiment which is further provided with a current blocking layer 15 made of p-type GaAs formed on either side of the ridge portion 142 of the n-type upper cladding layer 14 and n-side negative electrodes 18 formed on the n-type upper cladding layer 14 (on the ridge portion 142) and on the current blocking layers 15 via a contact layer 16, as shown in FIG. 4. The second embodiment has the same configuration as that of the first embodiment, except for the modification described above.

In the p-type GaAs layer formed as the current blocking layer 15 formed on either side of the ridge portion 142, it is difficult to achieve the required level of current block effect because electron diffusion distance is long under the ordinary conditions of forming the current blocking layer (carrier concentration being from 1 to $3 \times 10^{18}$ cm$^{-3}$ and thickness of about 1 $\mu$m). When the electron diffusion distance is taken into consideration, ensuring sufficient current block effect with a p-type GaAs layer having carrier concentration about 1 to $3 \times 10^{18}$ cm$^{-3}$ requires a thickness of about 3 to 5 $\mu$m which is not practical in view of the structure and production process.

Thus in the second embodiment, sufficient current block effect is achieved even when the thickness is about 1 $\mu$m, by setting the carrier concentration to $1 \times 10^{19}$ cm$^{-3}$ or higher in the current blocking layer 15 made of p-type GaAs.

That is, the present invention has been completed on the basis of the finding that sufficient current block effect is achieved even when the thickness is about 1 $\mu$m, by setting the carrier concentration to $1 \times 10^{19}$ cm$^{-3}$ or higher in the current blocking layer 15 made of p-type GaAs.

The semiconductor laser diode according to the second embodiment 2 made in such a configuration as described above has effects similar to those of the first embodiment, and is further capable of improving the carrier confining effect by means of the current blocking layer 15, and is therefore capable of high-efficiency operation.

Embodiment 3

Figure 5:
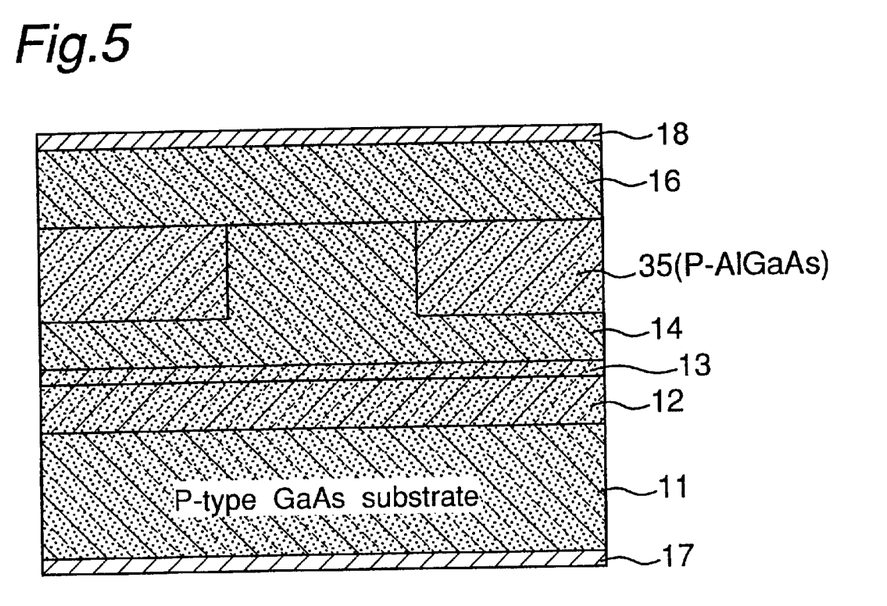
FIG. 5 is a schematic cross sectional view of the semiconductor laser diode according to the third embodiment of the present invention.

The semiconductor laser diode according to the third embodiment of the present invention has the same configuration as that of the second embodiment, except for a current blocking layer 35 made of a p-type semiconductor represented by general formula $Al_yGa_{1-y}As$ instead of the current blocking layer 15 made of p-type GaAs of the second embodiment as shown in FIG. 5.

In the third embodiment, proportion of Al content in the current blocking layer 35 is set to be higher than in the n-type upper cladding layer 14 made of $Al_xGa_{1-x}As$, namely (y>x) while the carrier concentration of the current blocking layer 35 is set to $1\times10^{18}$ cm$^{-3}$ or higher and thickness of the current blocking layer 35 is set to 0.5 μm or greater, in order to achieve higher current block effect. For the purpose of achieving higher current block effect, according to the third embodiment, it is preferable that the carrier concentration of the current blocking layer 35 be set to $3\times10^{18}$ cm$^{-3}$ or higher and thickness of the current blocking layer 35 be set to 1 μm or greater.

In the third embodiment, the p-type AlGaAs used in the current blocking layer 35 has:

(1) lower electron mobility (electron mobility of $Al_{0.4}Ga_{0.6}As$, for example, is 4000 cm$^2$/Vs while electron mobility of GaAs is 5000 cm$^2$/Vs), and (2) shorter carrier life (carrier life of $Al_{0.4}Ga_{0.6}As$ is several nano-seconds while carrier life of GaAs is 20 nsec in case the carrier concentration is $1\times10^{17}$ cm$^{-3}$), compared to GaAs used in the current blocking layer 15 of the second embodiment.

Therefore, electron diffusion distance of the current blocking layer 35 can be made shorter than that of the current blocking layer 15 of the second embodiment.

When the values of electron mobility and carrier concentration given in parentheses in (1) and (2) above are used, for example, calculation of electron diffusion distance shows that the electron diffusion distance of the current blocking layer 35 is about 20% of the electron diffusion distance of the current blocking layer 15 of the second embodiment.

With the semiconductor laser diode of the third embodiment made in such a configuration as described above, because the electron diffusion distance of the current blocking layer 35 can be made shorter than the electron diffusion distance of the current blocking layer 15 of the second embodiment, current block effect can be further improved and higher efficiency of operation can be obtained.

Also because the semiconductor laser diode of the third embodiment is provided with the current blocking layer 35 made of AlGaAs which absorbs less light emitted by laser oscillation compared to GaAs and therefore has substantially refraction index waveguide structure which makes it possible to lower the threshold compared to the second embodiment.

Embodiment 4

Figure 7A:
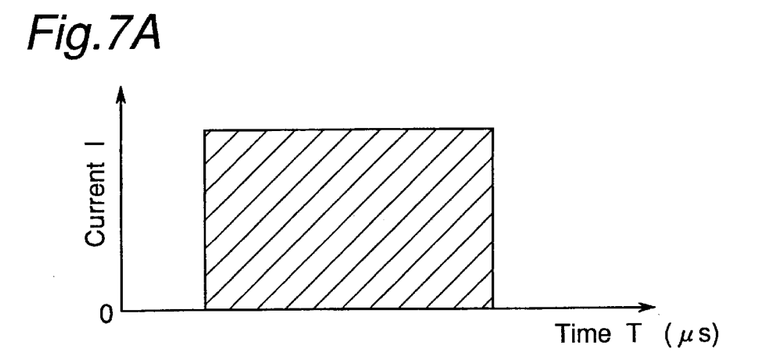
FIG. 7 is a graph for explaining the droop characteristic.

Semiconductor laser diode according to the fourth embodiment of the present invention has the configuration of the semiconductor laser diode of the third embodiment which is further provided with reflection layers 10, 20 having reflectivity in a range from 60% to 90% being formed on the resonating end faces. With this configuration, such a low droop characteristic is achieved that is required of a semiconductor laser diode used, for example, in laser beam printers and laser beam copying machines. Droop characteristic mentioned here is an index (FIG. 7B) which represents the rate of change (decreasing rate) in the optical output power given at a time when a specified period of time (tw) has passed since the start of laser oscillation in case a constant current is supplied as shown in FIG. 7A. The change in the optical output power is caused by the heat generated during laser oscillation.

Relationship between various characteristics of the semiconductor laser diode and droop characteristic will be described below.

Figure 7B:
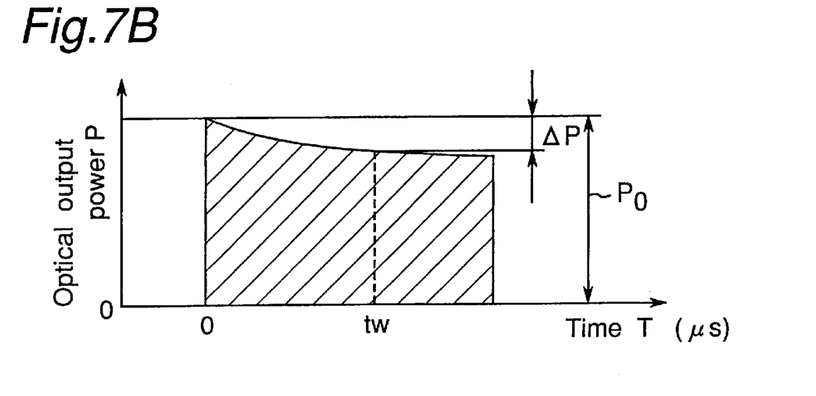

Assume that the optical output power at the start of oscillation (T=0) is Pa and the optical output power when a period of time tw has passed as Pb, then a change ΔP in the optical output power is given by equation 1.

$$\Delta P=\{(Pa-Pb)/Pb\}\times 100 \qquad \text{Equation 1}$$

Suppose the change in the optical output power is caused by a temperature rise of the active region (active layer 13) and an increase in the threshold current, then the optical output powers Pa and Pb are given by equations 2 and 3.

$$Pa=\eta_f\times(I_{OP}-I_{th}) \qquad \text{Equation 2}$$

$$Pb=\eta_f\times\{I_{OP}-I_{th}\exp(\Delta T/T_0)\} \qquad \text{Equation 3}$$

In equations 2 and 3, $I_{th}$ is the threshold current, $I_{OP}$ is the operating current, $\eta_f$ is front slope efficiency, ΔT is the temperature rise of the active region and $T_0$ is a characteristic temperature.

Substituting equations 2 and 3 in equation 1 yields equation 4 which gives the change ΔP as follows.

$$\Delta P=I_{th}\times\{\exp(\Delta T/T_0)-1\}/(I_{OP}-I_{th}\exp(\Delta T/T_0)) \qquad \text{Equation 4}$$

Because $\Delta T<T_0$, equation 4 can be reduced to equation 5 which gives an approximate value of ΔP as follows.

$$\Delta P=[1/\{(I_{OP}/I_{th})-1\}]\times(\Delta T/T_0) \qquad \text{Equation 5}$$

Figure 8:
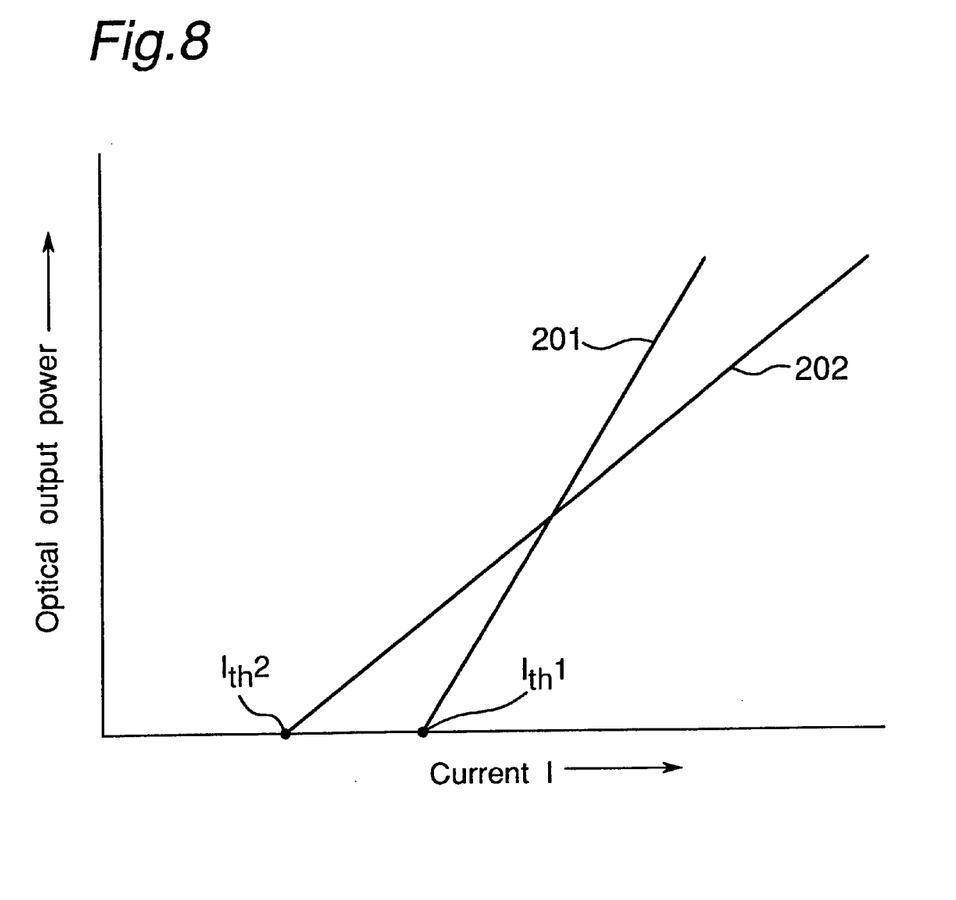
FIG. 8 is a graph for schematically explaining the slope efficiency.

Equation 5 shows that it is effective in decreasing the change ΔP to decrease the threshold current $I_{th}$ and increase the operating current $I_{OP}$ (decrease the slope efficiency). The slope efficiency mentioned here is given as (increase in optical output power)/(increase ΔI in current) for values of current above the threshold, and corresponds to the gradients of straight lines 201 and 202 of the graph in FIG. 8. For example, the straight line 201 of the graph in FIG. 8 has a greater slope efficiency that the straight line 202.

However, the semiconductor laser diodes of refraction index waveguide type described in the first and the third embodiments have higher slope efficiency than the semiconductor laser diode of gain wavelength structure described in the second embodiment, and therefore experience greater change ΔP.

Therefore, the fourth embodiment is configured to increase the reflectivity on the end faces so that the slope efficiency and the change ΔP become smaller. Although the slope efficiency may also be decreased by increasing the cavity length, increased cavity length causes the threshold to increase and is therefore not desirable. When droop characteristic is taken into consideration, because it is effective in decreasing the change ΔP to decrease the threshold and decrease the slope efficiency, increasing the cavity length to decrease the slope efficiency results in an increase in the threshold which works to increase the slope efficiency, and therefore cannot decrease the change ΔP as a net result.

As a result, it is more effective in decreasing the slope efficiency to control the reflectivity of the end face than increase the cavity length.

Figure 6:
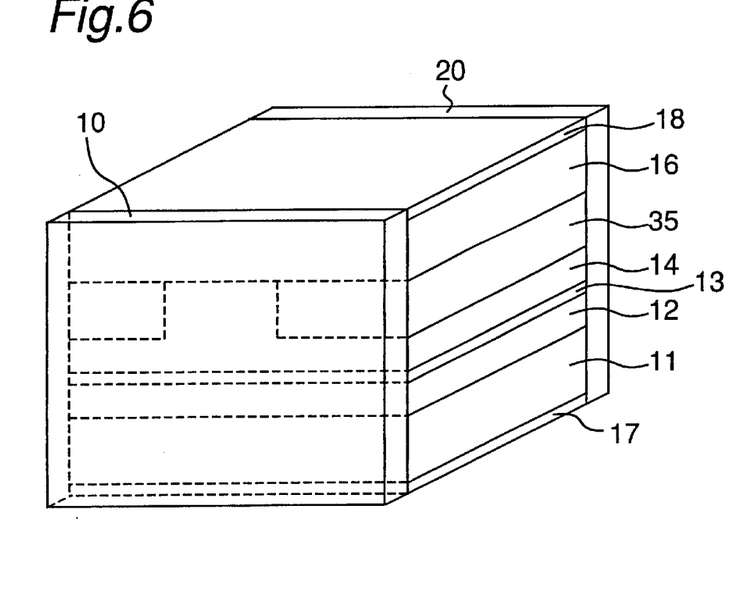
FIG. 6 is a schematic cross sectional view of the semiconductor laser diode according to the fourth embodiment of the present invention.

The reflectivity of the end face is preferably controlled within a range from 60% to 90% as described previously, which enables it to obtain a slope efficiency in a range from 40% to 80% that is normally achieved when the reflecting films 10, 20 are not formed (when reflection on cleavage surface is used).

Slope efficiency in case the reflector films 10, 20 are not formed (when reflection on cleavage surface is used) is about 0.4 to 0.6 W/A, for example, with a semiconductor laser diode having a cavity length of about 300 μm.

In the semiconductor laser diode of the fourth embodiment made in the configuration described above, because the reflecting films 10, 20 are formed on the facets and the reflectivity of the reflecting films 10, 20 is set in a range from 60% to 90%, the slope efficiency can be set to a relatively low value in correspondence to the reflectivity of the reflecting films 10, 20, thus improving the droop characteristic.

In the first through fourth embodiments described above, the p-type lower cladding layer 12 is formed in contact with the active layer 13 and the n-type upper cladding layer 14 is formed in contact with the active layer 13. However, the present invention is not limited to this configuration and such a configuration may also be employed as an optical guide layer is formed between the active layer 13 and the p-type lower cladding layer 12 and/or between the active layer 13 and the n-type upper cladding layer 14. Such a configuration also has an operation and effect similar to those of the first through the third embodiments. Also according to the present invention, another semiconductor layer, rather than the optical guide layer described above, may be formed in the n-type semiconductor region and/or p-type semiconductor region.

That is, the present invention specifies only that the semiconductor laser diode be made in such a configuration as a p-type GaAs substrate is used, an n-type upper cladding layer is provided in the n-type semiconductor region and a p-type lower cladding layer is provided in the p-type semiconductor region, and an active layer is provided between the n-type semiconductor region and the p-type semiconductor region.

Also the present invention is not limited to the semiconductor laser diode of the configurations described in the first through the fourth embodiments, but can be applied to semiconductor laser diodes having other structures such as VSIS type and SIS type. That is, the present invention can be applied to any semiconductor laser diode provided that a p-type GaAs substrate is used and an n-type cladding layer has such a configuration of current injection.

As will be clear from the above description, the semiconductor laser diode of the present invention is made in such a configuration as a semiconductor substrate made of p-type GaAs is used, the n-type AlGaAs upper cladding layer is made of $Al_xGa_{1-x}As$ where $x \geq 0.4$ and carrier concentration is set to within $6 \times 10^{17}$ cm$^{-3}$. With this configuration, because current injected through the ridge portion can be prevented from diffusing in the first region, performance equivalent to the conventional semiconductor laser diode made by using a n-type GaAs substrate 1 or higher can be achieved and also it is made possible to use in combination with pnp transistors.

When the semiconductor laser diode is further provided with current blocking layers made of p-type GaAs formed on both sides of the ridge portion of the n-type AlGaAs upper cladding layer and carrier concentration of the current blocking layer is set to $1 \times 10^{19}$ cm$^{-3}$ or higher, carrier can be effectively confined in the active layer and high-efficiency operation can be achieved.

Also when the semiconductor laser diode is provided with current blocking layers made of a material represented by general formula $Al_yGa_{1-y}As$ with thickness of 0.5 μm or greater being formed on both sides of the ridge portion of the n-type AlGaAs upper cladding layer and carrier concentration is set to $1 \times 10^{18}$ cm$^{-3}$ or higher, current block effect can be improved and absorption of light by the n-type AlGaAs can be decreased, thereby making it possible to operate at a high efficiency with a low current.

Further in the semiconductor laser diode, current block effect can be further improved and more highly efficient operation can be achieved by forming the current blocking layer with a thickness of 1 μm or greater and setting the carrier concentration to $3 \times 10^{18}$ cm$^{-3}$ or higher.

Also when the semiconductor laser diode is made in such a configuration that reflecting films are formed on both facets and the reflectivity of the reflecting films is set to within a range from 60% to 90%, droop characteristic can be improved, thereby making it possible to provide a semiconductor laser diode which is applicable to laser beam printers and laser beam copying machines.

Further in the semiconductor laser diode, even more improved droop characteristic can be obtained by setting the reflectivity of the reflecting films in a range from 70% to 80%.

What is claimed is:

1. A semiconductor laser diode comprising:
    a p-type GaAs semiconductor substrate;
    a p-type semiconductor region including a p-type AlGaAs lower cladding layer on said semiconductor substrate;
    an active layer on said p-type semiconductor region; and
    an n-type semiconductor region including an n-type AlGaAs upper cladding layer on said active layer, said n-type AlGaAs upper cladding layer comprising a first region covering substantially all of said active layer for confining light in said active layer and a ridge portion narrower than said first region for concentrating injected current in a laser oscillation region having a width in said active layer, wherein said n-type AlGaAs upper cladding layer is $Al_xGa_{1-x}As$, ($x \geq 0.4$), having a carrier concentration not exceeding $6 \times 10^{17}$ cm$^{-3}$ to prevent charge carriers from diffusing parallel to the width of said ridge in said first region of said n-type AlGaAs upper cladding layer and to achieve laser oscillation.

2. The semiconductor laser diode according to claim 1, further comprising a p-type GaAs current blocking layer having a carrier concentration of at least $1 \times 10^{19}$ cm$^{-3}$ and located on both opposite sides of and contacting said ridge portion of said n-type AlGaAs upper cladding layer for blocking leakage current flow and achieving laser oscillation.

3. The semiconductor laser diode according to claim 1, further comprising a p-type $Al_yGa_{1-y}As$ current blocking layer located on opposite sides of and contacting said ridge portion, having a thickness of at least 0.5 μm, $y \geq x$, and a carrier concentration of at least $1 \times 10^{18}$ cm$^{-3}$ for blocking leakage current flow and achieving laser oscillation.

4. The semiconductor laser diode according to claim 3, wherein said current blocking layer has a thickness of at least 1 μm and a carrier concentration of at least $3 \times 10^{18}$ cm$^{-3}$.

5. The semiconductor laser diode according to claim 1, further comprising a reflecting film on resonating end faces of said laser diode and having a reflectivity within a range of from 60% to 90%.

6. The semiconductor laser diode according to claim 5, wherein the reflectivity of said reflecting film is within a range from 70% to 80%.

7. A semiconductor laser diode comprising:

a p-type GaAs semiconductor substrate;

a p-type semiconductor region including a p-type AlGaAs lower cladding layer on said semiconductor substrate;

an active layer on said p-type semiconductor region;

an n-type semiconductor region including an n-type AlGaAs upper cladding layer on said active layer, said n-type AlGaAs upper cladding layer comprising a first region covering substantially all of said active layer for confining light in said active layer and a ridge portion narrower than said first region for concentrating injected current in a laser oscillation region having a width in said active layer, wherein said n-type AlGaAs upper cladding layer is $Al_xGa_{1-x}As$, ($x \geq 0.4$) and has a carrier concentration not exceeding $6 \times 10^{17}$ cm$^{-3}$ and no current blocking layer is disposed on said n-type AlGaAs upper cladding layer; and an electrode confined to said ridge portion whereby current is efficiently injected into the laser oscillation region without current leakage through any current blocking layer.

* * * * *